(12) United States Patent
Nicosia et al.

(10) Patent No.: US 6,292,405 B1
(45) Date of Patent: Sep. 18, 2001

(54) DATA OUTPUT BUFFER WITH PRECHARGE (75) Inventors: Salvatore Nicosia, Palermo; Giovanni Pagano; Luca Giuseppe De Ambroggi, both of Catania; Gaetano Palumbo, Tremestieri Etneo, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/636,363

(22) Filed: Aug. 11, 2000

(51) Int. Cl.$^7$ ........................................... G11C 7/00
(52) U.S. Cl. ........................... 365/189.05; 365/203
(58) Field of Search ........................... 365/189.05, 203, 365/185.25

(56) References Cited

U.S. PATENT DOCUMENTS 5,058,066 * 10/1991 Yu ............................... 365/189.05
5,638,328 * 6/1997 Cho ............................. 365/189.05
5,796,661 * 8/1998 Kim ............................ 365/189.05
5,905,684 * 5/1999 Hill ............................. 365/203

* cited by examiner

Primary Examiner—Tan T. Nguyen
(74) Attorney, Agent, or Firm—Theodore E. Galanthay; Allen, Dyer, Doppelt Milbrath & Gilchrist, P.A.

(57) ABSTRACT

A data output buffer includes an output node, and a first stage connected to the output node for providing a first control signal for precharging the output node to an intermediate voltage with respect to a voltage for switching the output node from a current logic state to a different logic state. A second stage is connected to the first stage and to the output buffer. The first and second stages are responsive to a second control signal for enabling output of new data. A precharge logic circuit precharges the output node to the intermediate voltage as a function of data last output, and as a function of first and second reset signals until a rising and falling edge of the data last output respectively crosses the intermediate voltage.

30 Claims, 5 Drawing Sheets

DATA OUTPUT BUFFER WITH PRECHARGE

FIELD OF THE INVENTION

The present invention relates to integrated digital systems, and, more particularly, to a data output buffer for an integrated digital system having low noise characteristics, especially for CMOS integrated devices and static memories. The data output buffer provides for high speed transitions to meet stringent speed performance requirements.

BACKGROUND OF THE INVENTION

Many integrated digital systems that process and/or handle digital data streams are provided with an array of output buffers for driving the lines of a data bus. The data output buffers are to prevent undesired electrical interactions between the source of the data to be made available external the system, and the driven external circuitry.

In view of the relatively large capacitance of the driven external circuitry, the peak of current absorbed from the supply rails upon the switching between logic states may cause a switching noise on the supply rails. The switching noise may be due to an unavoidable resistive drop, and may effect sensitive data processing circuits that are upstream of the output buffers.

The supply voltage is commonly generated and regulated externally and applied to the integrated circuit. The supply voltage within the integrated circuit may be subject to variations due to internal resistive drops proportional to the absorbed current, and to inductive effects inversely proportional to the rise time of the step function of absorbed current. Both of these effects contribute to the supply noise.

Switching noise is always present, but is particularly intense during the charging phase of a new datum being output. In the charging phases each output buffer absorbs a relatively large current to charge the external load capacitance. This causes a noise spike that may slow down propagation of the signals inside the integrated circuit and/or cause errors.

An example of an integrated system are memory devices. Static memories are typical integrated systems that may be effected by switching noise caused by the array of data output buffers. The data output buffers may cause spurious switching of the input address latches. A read cycle in a nonvolatile memory is characterized by pointing to a new memory location, reading a new datum and outputting the new datum. In standard memory devices the reading of a new datum and the outputting of it takes place at different times. The effects of the noise spikes can thus be controlled in a relatively straightforward manner.

In contrast, in an interleaved memory the problem is more severe because each output buffer is slaved to distinct banks of the memory that alternately convey a new read datum. Through an internal common data bus, the control circuits of a bank transfer the new read datum towards the output circuits so the reading of a datum may take place at the same time the previously read datum (from a different bank) is being output. This makes the problems represented by the output switching noise more critical.

A similar situation may be present in any integrated digital system in which there are two or more asynchronous data sources that must be functionally conveyed, for example, in an interleaved manner. The data is provided to a single output register driving a single buffer (serial output stream), or an array of buffers (parallel output stream). The amplitude of the switching noise spikes can be reduced, according to a conventional technique, by limiting the maximum current absorbed by a buffer or an array of buffers while switching the output. This is done while slowing down the speed of the system.

When speed is of significant importance, there have been several proposals for reducing the switching noise by charging the output node to an intermediate voltage. The intermediate voltage is between the voltage corresponding to a high logic level of the output node and to the voltage of a low logic level of the output node. In this way, the actual switching of the output toward the logic level corresponding to the known datum to be output will occur under a reduced driving voltage. For the same speed, the current absorption from the supply rails can be reduced, and thus the amplitude of the noise spikes.

European Patent No. 251,910 discloses an output buffer wherein the switching noise is reduced by driving the gates of the driver through an appropriate RC circuit. A drawback of this approach is the reduced speed of the entire circuit. U.S. Pat. No. 5,179,300 discloses an output CMOS buffer with feedback loops to precharge the output node at an intermediate voltage between a logic high and a logic low. U.S. Pat. No. 4,893,276, U.S. Pat. No. 5,179,300 and U.S. Pat. No. 5,058,066 all disclose precharge circuits for a data output buffer. For memory devices, an input address transition detector circuit provides a useful pulse for commanding a precharging of the output node. This is done in expectation of a new datum to be output after being read from the memory cell array.

These known techniques, though effective in reducing output switching noise, have a number of shortcomings. There is a substantial unpredictability of the actual intermediate voltage level to which the output node is brought during the precharge phase.

The level of precharge of the output node forced by the circuitry stimulated from a command pulse remains uncorrelated from the actual state of charge of the output node. The command pulse is commonly derived from the input address transition detecting circuitry. For example, this is the case upon reentering from a stand-by period, or when the outputs are being forced by other devices of the system interfaced on the same data bus.

U.S. Pat. No. 5,058,066 discloses an output buffer precharge circuit for a DRAM wherein noise may be decreased during transitions from CMOS level to the TTL level by precharging the output node of the buffer. The precharging is done by using an auxiliary final stage timely driven for precharging the output node to an intermediate voltage level.

A drawback of these known approaches to the problem of reducing switching noise by precharging the output node to an intermediate voltage level is the fact that the precharge process is controlled only in terms of its evolution in time. This leaves to a large extent undetermined the actual precharging level that is directly tied to the actual capacitance of the driven external circuitry. This also includes the spread of electrical parameters in the fabrication process and/or in the conditions of operation (e.g., temperature). Another problem is that under certain circumstances undesirable oscillations of the output node from one logic state to another may be caused by the precharge loops.

SUMMARY OF THE INVENTION

An object of the present invention is to provide for the precharging of the output node of an output data buffer to a precisely established intermediate precharging voltage as a function of the preexisting state of charge of the output node.

This and other objects, advantages and features of the present invention are provided using an internal latch for storing the current logic state of the output node of the buffer that controls the operation of the precharge circuit of the output node. Distinct reset signals are produced for the high side driver of the CMOS output stage P-channel transistor, and for the driver control logic of the N-channel transistor. These reset signals are obtained by comparing the signal present at the output of the internal latch with preestablished intermediate voltage threshold values.

The output buffer of the present invention has precharge loops for the output node that includes comparators that precisely set the intermediate voltage level of precharge, irrespective of external or incidental conditions. The precharging levels are preferrably defined in the design stage to exclude the possibility of causing oscillations about a single intermediate threshold level of precharging for the output node.

DETAILED DESCRIPTION OF THE PREFERRED EMBODIMENTS

Figure 1:
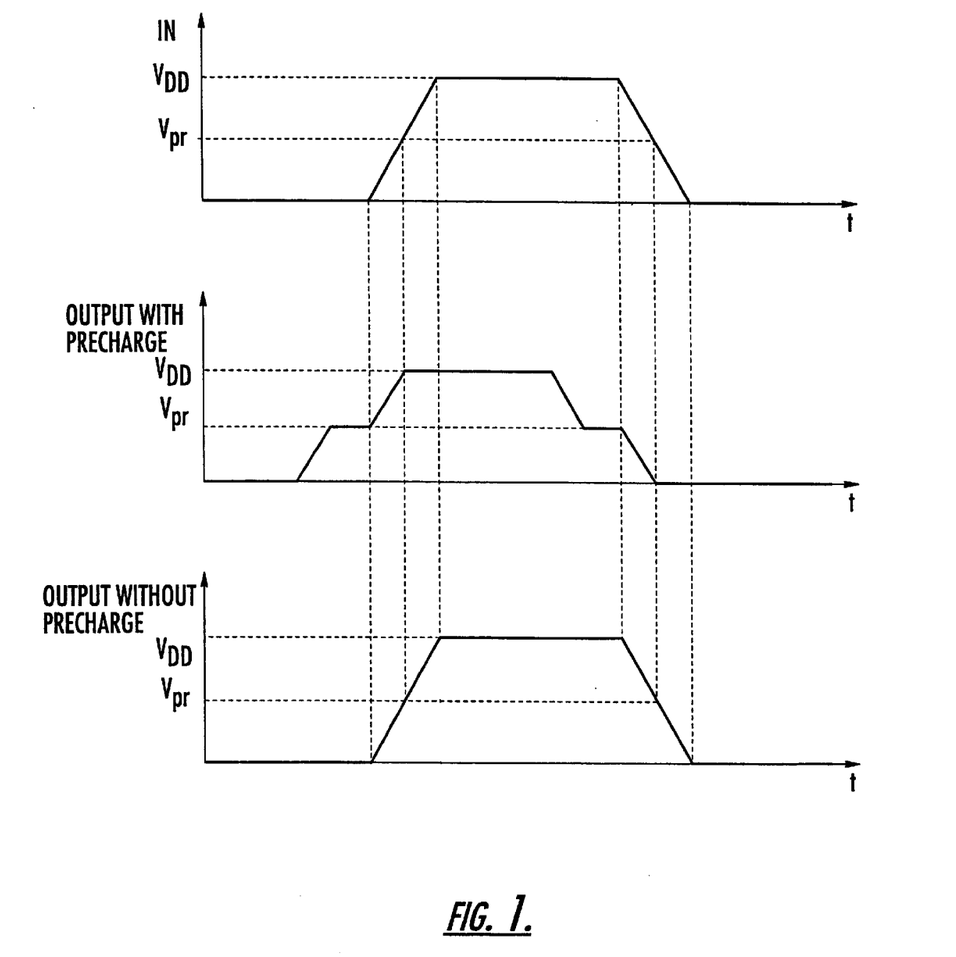
FIG. 1 are waveforms of a datum, the corresponding buffer output without any precharging, and the corresponding buffer output with precharging in accordance with the present invention.
Figure 2:
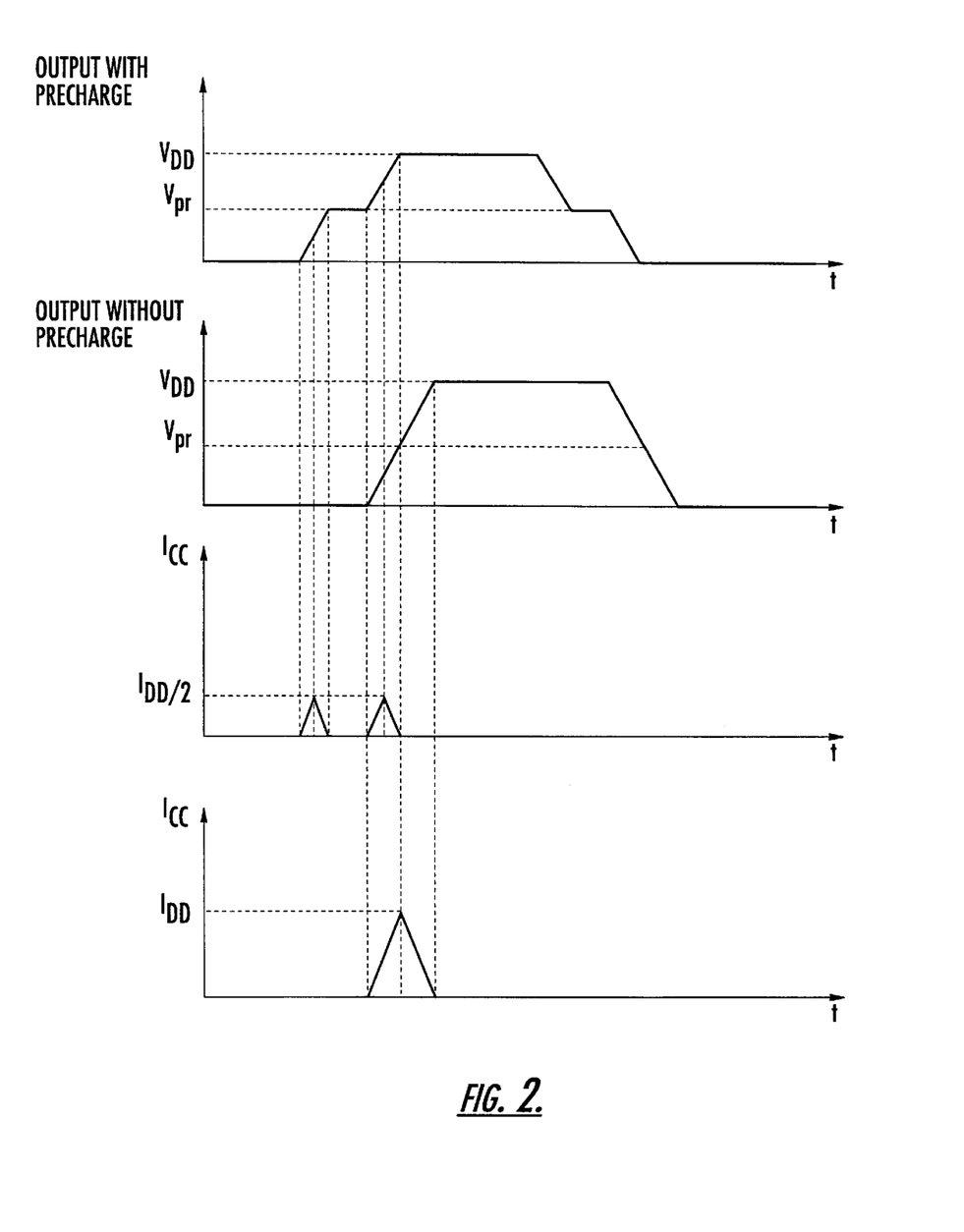
FIG. 2 are waveforms illustrating the effect of precharging on the current absorption peaks in accordance with the present invention.

Idealized waveforms of a data output buffer with and without precharge functionality are depicted in FIG. 1. In FIG. 2, the effect of the precharge functionality of the waveforms of the current absorbed by the final stage of the buffer from the supply rails are illustrated. The limitation of the amplitude of the current peaks absorbed by the supply rails reduces the switching noise caused by the switchings of the output buffer.

Figure 3:
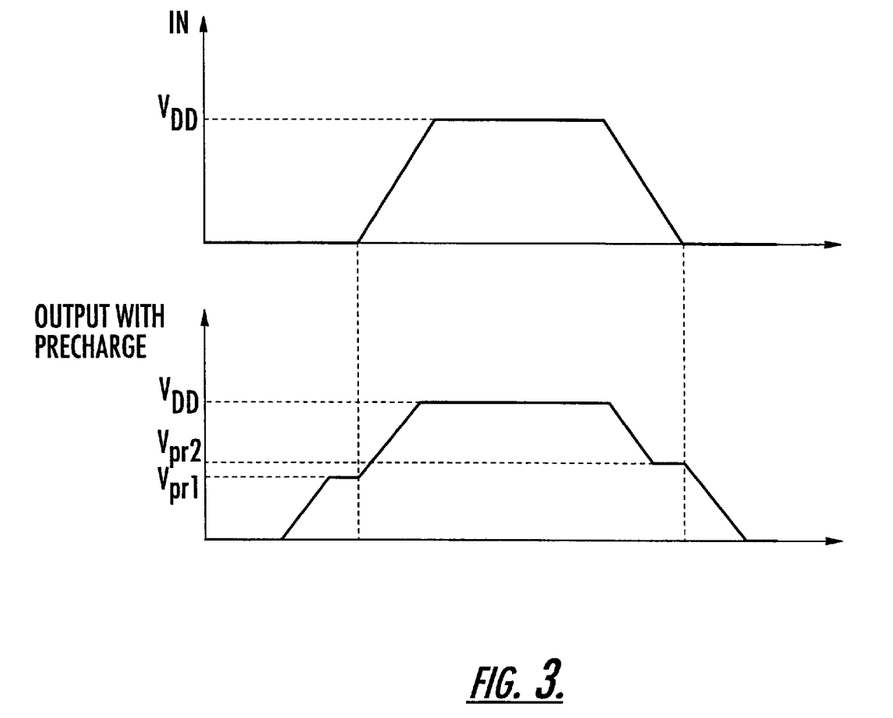
FIG. 3 are waveforms of a preferred condition imposed on the control circuitry for the output mode precharging to prevent oscillations in accordance with the present invention.

According to a preferred embodiment of the present invention, possible oscillations about the intermediate voltage level of precharging (Vpr in FIGS. 1 and 2) is effectively prevented by defining noncoincident intermediate voltage levels of precharging Vpr1 and Vrp2. This is done depending on whether the outputting of the new datum will imply a 0 to 1 or a 1 to 0 switching, as depicted in FIG. 3.

Figure 4:
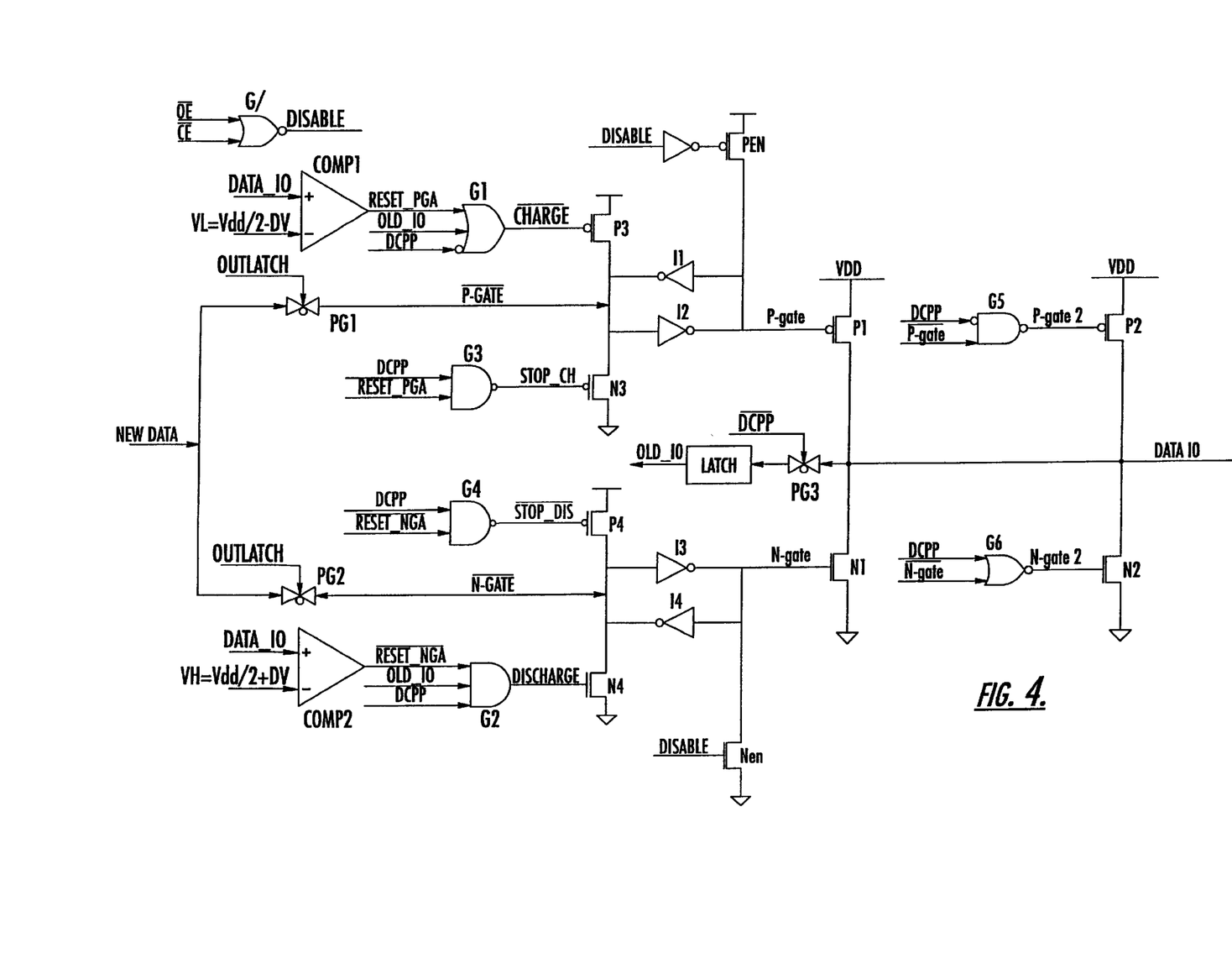
FIG. 4 is a basic circuit diagram of the data output buffer with precharging features in accordance with the present invention.

A precharge buffer according to the present invention is shown in FIG. 4. Basically, the data output buffer for an integrated digital system according to the present invention is controlled by a precharge control signal (DCPP) that is suitably generated by a dedicated circuit, by a second signal (OUTLATCH) enabling the output of a new datum (DATA), and optionally by a third signal (DISABLE) placing the final stage of the buffer in a tristate condition.

The output buffer comprises a CMOS output stage (P2, N2), a control logic being driven by the signals P-GATE2, N-GATE2 in the output stage, and a CMOS output precharge stage (P1, N1). An output precharge logic circuit is controlled by the precharge control signal (DCPP) for controlling the CMOS output precharge stage by signals P-GATE and N-GATE.

According to a first embodiment of the present invention, the output precharge logic circuit includes a first latch (LATCH). The input of the first latch is coupled to the output node (DATA I/O) through a second pass-gate (PG3) controlled by the precharge control signal (DCPP) This latch provides at an output a signal (OLD_I/O) corresponding to the last datum present on the output node (DATA I/O).

Comparator means comprising first (COMP1) and second (COMP2) comparators respectively compare the datum (DATA_I/O) with an intermediate voltage of the full logic low voltage (VL=VDD/2−DV) and of the full logic high voltage (VH=VDD/2+DV). A reset signal is output for the high side driver control logic of the output stage (RESET_P-GATE), and a reset signal is output for the low side driver control logic of the output stage (RESET_N-GATE) A first logic OR gate (G1) combines the reset signal (RESET_P-GA) output by the first comparator (COMP1) with the latched last datum (OLD_I/O), and with an inverted replica of the precharge control signal (DCPP). This is done for driving a P-channel transistor (P3) of a first CMOS gate. The N-channel transistor (N3) is driven by the ANDed precharge control signal, and reset signal (RESET_P-GATE) for the control logic of the high side driver of the output stage.

A second logic AND gate (G2) combines the reset signal (RESET_N-GATE) output by the second comparator COMP2 with the latched last datum (OLD_I/O), and with the precharge control signal (DCPP). This is done for driving an N-channel transistor (N4) of a second CMOS gate. The P-channel transistor (P4) is driven by the NANDED precharge control signal, and an inverted replica of the reset signal (RESET_N-GATE) for the control logic of the low side driver of the output stage.

Second (I1, I2) and third (I3, I4) latches functionally in cascade to the first (P3,N3) and second (P4, N4) CMOS gates, respectively, couple the output of the first pass-gate (PG1) to the gate of the P-channel transistor (P1) and to the gate of the N-channel transistor of the CMOS output stage. The third signal DISABLE is active when the precharge control signal DCPP and the signal OUTLATCH are both disabled.

The approach of preestablishing the actual precharge level by introducing comparators in the logic control loop of the precharging process renders the overall structure extremely fast. There are no penalties in terms of a reduction of speed as common according to the prior art approaches for addressing the problem of noise reduction. This permits a further reduction of the noise by avoiding the turn on of both the final stages during the precharging phase by turning on only a part of it. Consequently, the two additional logic gates G5 and G6 respectively force a logic 0 and a logic 1 on the control nodes N-GATE2 and P-GATE2 of the final CMOS stage formed by P2 and N2. This turns off the respective transistors during a precharge phase. This contributes to a reduction in the switching current on the supply rails for reducing the noise caused by inductive and resistive effects in addition to power dissipation.

Figure 5:
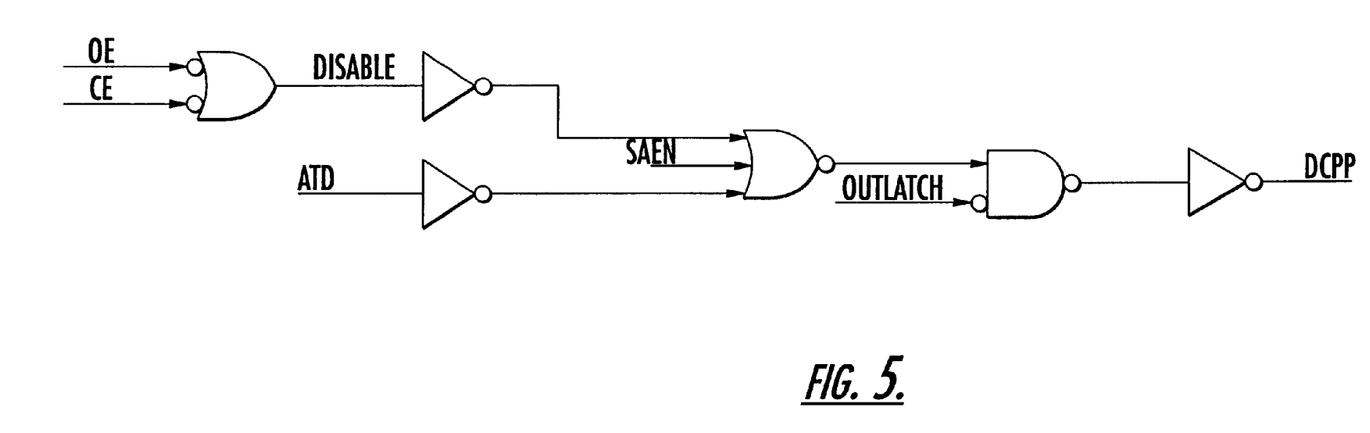
FIG. 5 is a circuit diagram for a static memory that generates the precharge pulse DCPP for the data output buffer illustrated in FIG. 4.

A suitable circuit for generating the precharge control circuit DCPP is illustrated in FIG. 5. The intervening signals are, by way of example, those typical of a memory device. OE and CE are protocol signals. One signal enables the output of a new datum read from the memory, and the other enables the memory device. This is for systems where many devices share the same bus. Their combination provides the third signal DISABLE.

ATD is the address transition detection pulse that is commonly generated at the input of a memory device. SAEN is an internal control signal that enables the sense amplifiers to perform the reading of the datum stored in the newly addressed location of the memory. Outlatch is an internally generated control signal for enabling the output of a new read datum.

That which is claimed is:

1. A data output buffer comprising:

an output node;

a first CMOS stage connected to the output node for providing a first control signal for precharging the output node to an intermediate voltage with respect to a voltage for switching the output node from a current logic state to a different logic state;

a second CMOS stage connected to said first CMOS stage and to the output node, said first and second CMOS stages being responsive to a second control signal for enabling output of new data, and said first and second CMOS stages being responsive to a third control signal for driving said first and second CMOS stages to a tristate condition when the output node is being precharged;

a control latch connected to said first and second CMOS stages and to the output node, said control latch being responsive to the first control signal for latching data present on the output node and for providing a signal corresponding to data last output from the output node;

a first comparator for comparing the data present on the output node to a first intermediate reference voltage, and outputting a first reset signal;

a second comparator for comparing the data present on the output node to a second intermediate reference voltage, and outputting a second reset signal; and a first pair of set and reset latches connected between said first CMOS stage and said first comparator, and a second pair of set and reset latches connected between said first CMOS stage and said second comparator, said first and second pairs of set and reset latches for driving said first CMOS stage so that the output node is precharged as a function of the signal corresponding to the data last output and as a function of the first and second reset signals until a rising and falling edge of the data last output respectively crosses the intermediate voltage.

2. An output buffer according to claim 1, wherein said first and second comparators each comprises a Schmidt trigger; and wherein the first intermediate reference voltage of said first comparator is different from the second intermediate reference voltage of said second comparator.

3. An output buffer according to claim 1, further comprising:

an input node for receiving the new data; and a first pair of pass-gates connected between the input node and said first CMOS stage, said first pair of pass-gates being responsive to the second control signal.

4. An output buffer according to claim 1, further comprising a third pass-gate connected between said control latch and said first CMOS stage, said third pass-gate being responsive to the first control signal.

5. An output buffer according to claim 1, further comprising:

a first logic gate connected to an output of said first comparator for receiving the first control signal, the signal corresponding to data last output from the output node, and the first reset signal from said first comparator for providing a first driving signal; and a second logic gate connected to an output of said second comparator for receiving the first control signal, the signal corresponding to data last output from the output node, and the second reset signal from said second comparator for providing a second driving signal.

6. An output buffer according to claim 5, further comprising:

a first pull-up/pull-down device connected between said first logic gate and said first CMOS stage, said first pull-up/pull-down device being responsive to the first driving signal; and a second pull-up/pull-down device connected between said second logic gate and said first CMOS stage, said second pull-up/pull-down device being responsive to the second driving signal.

7. An output buffer according to claim 6, further comprising:

a third logic gate having an output connected to said first pull-up/pull-down device and inputs for receiving the first control signal and the first reset signal from said first comparator, said first pull-up/pull-down device being responsive to an output signal from said third logic gate; and a fourth logic gate having an output connected to said second pull-up/pull-down device and inputs for receiving the first control signal and the second reset signal from said second comparator, said second pull-up/pull-down device being responsive to an output signal from said fourth logic gate.

8. An output buffer according to claim 1, further comprising:

a fifth logic gate having an output connected to said second CMOS stage and inputs for receiving the first control signal and a first logic signal from said first pair of set and reset latches; and a sixth logic gate having an output connected to said second CMOS stage and inputs for receiving the first control signal and a second logic signal from said second pair of set and reset latches, said fifth and sixth logic gates for driving said second CMOS stage to the tristate condition when the output node is being precharged.

9. An output buffer according to claim 1, wherein the third control signal is active when the first and second control signals are disabled.

10. A data output buffer comprising:

an output node;

a first stage for precharging the output node to an intermediate voltage with respect to a voltage for switching the output node from a current logic state to a different logic state;

a second stage connected to said first stage, said first and second stages responsive to a second control signal for enabling output of new data; and a precharge logic circuit for precharging the output node to the intermediate voltage based upon a rising and falling edge of data last output respectively crossing the intermediate voltage.

11. An output buffer according to claim 10, wherein said first and second stages each comprises at least one N-channel MOSFET and at least one P-channel MOSFET connected together for defining respective first and second CMOS stages.

12. An output buffer according to claim 10, further comprising:
   an input node for receiving the new data; and
   a first pair of pass-gates connected between the input node and said first stage, said first pair of pass-gates being responsive to the second control signal.

13. An output buffer according to claim 10, wherein said precharge logic circuit comprises a control latch connected to said first and second stages and to the output node, said control latch being responsive to the first control signal for latching data present on the output node and for providing a signal corresponding to the data last output from the output node.

14. An output buffer according to claim 13, further comprising a third pass-gate connected between said control latch and said first stage, said third pass-gate being responsive to the first control signal.

15. An output buffer according to claim 10, wherein said precharge logic circuit comprises:
   a first comparator for comparing the data present on the output node to a first intermediate reference voltage, and outputting a first reset signal; and
   a second comparator for comparing the datum present on the output node to a second intermediate reference voltage, and outputting a second reset signal.

16. An output buffer according to claim 15, wherein said precharge logic circuit comprises a first pair of set and reset latches connected between said first stage and said first comparator, and a second pair of set and reset latches connected between said first stage and said second comparator, said first and second pairs of set and reset latches for driving said first stage so that the output node is precharged to the intermediate voltage as a function of the data last output and as a function of the first and second reset signals.

17. An output buffer according to claim 16, further comprising:
   a fifth logic gate having an output connected to said second stage and inputs for receiving the first control signal and a first drive signal from said first pair of set and reset latches; and
   a sixth logic gate having an output connected to said second stage and inputs for receiving the first control signal and a second drive signal from said second pair of set and reset latches, said fifth and sixth logic gates for driving said second stages to a tristate condition when the output node is being precharged.

18. An output buffer according to claim 15, further comprising:
   a first logic gate connected to an output of said first comparator for receiving the first control signal, a signal corresponding to data last output from the output node, and the first reset signal for providing a first driving signal; and
   a second logic gate connected to an output of said second comparator for receiving the first control signal, the signal corresponding to data last output from the output node, and the second reset signal for providing a second driving signal.

19. An output buffer according to claim 18, further comprising:
   a first pull-up/pull-down device connected between said first logic gate and said first stage, said first pull-up/pull-down device being responsive to the first driving signal; and
   a second pull-up/pull-down device connected between said second logic gate and said first stage, said second pull-up/pull-down device being responsive to the second driving signal.

20. An output buffer according to claim 19, further comprising:
   a third logic gate having an output connected to said first pull-up/pull-down device and inputs for receiving the first control signal and the first reset signal from said first comparator, said first pull-up/pull-down device being responsive to an output signal from said third logic gate; and
   a fourth logic gate having an output connected to said second pull-up/pull-down device and inputs for receiving the first control signal and the second reset signal from said second comparator, said second pull-up/pull-down device responsive to an output signal from said fourth logic gate.

21. An output buffer according to claim 15, wherein said first and second comparators each comprises a Schmidt trigger; and wherein the first intermediate reference voltage of said first comparator is different from the second intermediate reference voltage of said second comparator.

22. An output buffer according to claim 10, wherein said first and second stages are responsive to a third control signal for driving said first and second stages to a tristate condition when the output node is being precharged.

23. An output buffer according to claim 22, wherein the third control signal is active when the first and second control signals are disabled.

24. A method for switching an output node of a data output buffer from a current logic state to a different logic state, the method comprising:
   providing a first control signal to first and second stages for precharging the output node to an intermediate voltage with respect to a voltage;
   providing a second control signal to the first and second stages for enabling output of new data; and
   precharging the output node to the intermediate voltage based upon a rising and falling edge of data last output respectively crossing the intermediate voltage.

25. A method according to claim 24, further comprising:
   latching data present on the output node; and
   providing a signal corresponding to the data last output from the output node.

26. A method according to claim 24, further comprising:
   comparing data present on the output node to a first intermediate reference voltage using a first comparator, and outputting a first reset signal; and
   comparing data present on the output node to a second intermediate reference voltage using a second comparator, and outputting a second reset signal.

27. A method according to claim 26, wherein the first intermediate reference voltage is different from the second intermediate reference voltage.

28. A method according to claim 26, further comprising:
   combining the first control signal, a signal corresponding to data last output from the output node, and the first reset signal from the first comparator for providing a first drive signal; and
   combining the first control signal, the signal corresponding to data last output from the output node, and the second reset signal from the second comparator for providing a second drive signal, the first and second stages being driven so that the output node is precharged to the intermediate voltage as a function of the data last output and as a function of the first and second reset signals.

29. A method according to claim 24, further comprising driving the first and second stages to a tristate condition when the output node is being precharged.

30. A method according to claim 29, wherein driving the first and second stages to a tristate condition is responsive to a third control signal that is active when the first and second control signals are disabled.

* * * * *